United States Patent
Wang et al.

(10) Patent No.: US 12,007,456 B2
(45) Date of Patent: Jun. 11, 2024

(54) LIMITING RF ALTERNATING MAGNETIC FIELD IN MRI

(71) Applicant: Siemens Healthcare GmbH, Erlangen (DE)

(72) Inventors: Ying Lun Wang, Shenzhen (CN); Qiu Yi Zhang, Shenzhen (CN); Zhi Bin Li, Shenzhen (CN)

(73) Assignee: Siemens Healthineers AG, Erlangen (DE)

( * ) Notice: Subject to any disclaimer, the term of this patent is extended or adjusted under 35 U.S.C. 154(b) by 10 days.

(21) Appl. No.: 18/079,525

(22) Filed: Dec. 12, 2022

(65) Prior Publication Data

US 2023/0184857 A1    Jun. 15, 2023

(30) Foreign Application Priority Data

Dec. 13, 2021    (CN) .......................... 202111517254.7

(51) Int. Cl.
*G01R 33/32* (2006.01)
*G01R 33/422* (2006.01)

(52) U.S. Cl.
CPC ........... *G01R 33/422* (2013.01); *G01R 33/32* (2013.01)

(58) Field of Classification Search
CPC ...... G01R 33/422; G01R 33/32; G01R 33/00; G01R 33/0035; G01R 33/0023; G01R 33/0017; G01R 31/3191; G01R 33/0358; G01R 33/0356; G01B 7/004; G01C 17/38; G06F 3/017; G06F 3/0346; G06F 3/012; H01L 39/223
See application file for complete search history.

(56) References Cited

U.S. PATENT DOCUMENTS

| | | | |
|---|---|---|---|
| 2013/0154647 A1* | 6/2013 | Yang | G01R 33/283 324/318 |
| 2015/0204953 A1* | 7/2015 | Ookawa | G01R 33/4833 324/309 |
| 2019/0353719 A1* | 11/2019 | Hesels | A61B 5/055 |
| 2021/0161498 A1* | 6/2021 | Hu | G01R 33/3854 |

* cited by examiner

*Primary Examiner* — Jermele M Hollington
*Assistant Examiner* — Taqi R Nasir
(74) *Attorney, Agent, or Firm* — Banner & Witcoff Ltd.

(57) ABSTRACT

A method and apparatus for limiting an RF alternating magnetic field in MRI. The method includes: measuring a perpendicular distance between a local coil placed on a scanned part of a patient and the center of a detection hole of a magnetic resonance (MR) scanner; based on the perpendicular distance, determining a deviation between the B1 field strength at the position of the local coil during an MR scan and the B1 field strength at the center of the detection hole; based on the deviation, computing a conversion coefficient for conversion between the B1 field strength at the position of the local coil and the B1 field strength at the center of the detection hole; based on the B1 field strength required when the surface temperature of the local coil is equal to a safe temperature upper limit and the conversion coefficient, computing a maximum permissible field strength of the B1 field at the center of the detection hole. The B1 field may be limited to a smaller but still effective field strength range, reducing wastage of B1 field performance while ensuring patient safety and MR imaging quality.

12 Claims, 6 Drawing Sheets

LIMITING RF ALTERNATING MAGNETIC FIELD IN MRI

TECHNICAL FIELD

The present disclosure relates to the technical field of MR (magnetic resonance), in particular to a method and apparatus for limiting an RF alternating magnetic field in MRI (magnetic resonance imaging), and an MR scanner.

BACKGROUND

The IEC standard for medical electrical equipment stipulates that during an MR scan, the surface temperature of a local coil placed on the part of the body being scanned must remain under 41° C. at the RF power, to prevent injury to the body. However, this standard does not specify which method should be used to meet this requirement.

NEMA (National Electrical Manufacturers Association) MS-14 is a new standard which provides a detailed description of an RF heating test for evaluating the safety of an MR local coil. The new MS-14 test standard requires the surface temperature of a local coil to be measured when thermal equilibrium is reached; thus, the RF alternating magnetic field generated by a transmit coil, i.e. the B1 field needs to be limited and monitored more strictly, so that old RF coils still comply with the new standard.

At present, most MR scanners limit the B1 field according to the patient SAR (specific absorption rate) or the surface heating angle of the RF coil. When such a method is used, the field strength of the B1 field is generally limited to a very low value, so that: even if the local coil contacts the wall of the detection hole of the MR scanner, the surface temperature of the local coil can still remain under 41° C. However, most patients are quite slim, so the local coil placed on the scanned part of the patient is still quite far away from the hole wall. Thus, if the field strength of the B1 field is set too low, the performance of the B1 field will be wasted.

SUMMARY

In view of the above, the aspects of the present disclosure propose a B1 field limiting method and apparatus in MRI, to reduce wastage of B1 field performance while ensuring patient safety and MR imaging quality;
and the aspects of the present disclosure further propose an MR scanner, to reduce wastage of B1 field performance while ensuring patient safety and MR imaging quality.

The technical solution of the aspects of the present disclosure is realized as follows:

A method for limiting an RF alternating magnetic field in MRI, the method comprising:
measuring a perpendicular distance between a local coil placed on a scanned part of a patient and the center of a detection hole of a magnetic resonance (MR) scanner;
based on the perpendicular distance between the local coil and the center of the detection hole, determining a deviation between the field strength of the RF alternating magnetic field at the position of the local coil during an MR scan and the field strength of the RF alternating magnetic field at the center of the detection hole;
based on the deviation, computing a conversion coefficient for conversion between the field strength of the RF alternating magnetic field at the position of the local coil and the field strength of the RF alternating magnetic field at the center of the detection hole;
based on the field strength of the RF alternating magnetic field required when the surface temperature of the local coil is equal to a safe temperature upper limit and the conversion coefficient, computing a maximum permissible field strength of the RF alternating magnetic field at the center of the detection hole.

In the above aspect, by measuring the perpendicular distance between the local coil and the center of the detection hole of the MR scanner, since the perpendicular distance between the local coil and the center of the detection hole of the MR scanner is in a correspondence relationship with the field strength deviation therebetween, and there is a fixed conversion relationship between the field strengths at the local coil and the center of the detection hole with the field strength deviation therebetween, it is possible to compute the maximum permissible field strength of the B1 field at the center of the detection hole according to the B1 field strength required when the surface temperature of the local coil is equal to a safe temperature upper limit and the conversion relationship, and it is thereby possible to limit the B1 field to a smaller but still effective field strength range, thus reducing wastage of B1 field performance while ensuring patient safety and MR imaging quality.

The step of computing, based on the deviation, a conversion coefficient for conversion between the field strength of the RF alternating magnetic field at the position of the local coil and the field strength of the RF alternating magnetic field at the center of the detection hole, comprises:

$$\alpha = 10^{S/20}$$

where $\alpha$ is the conversion coefficient, and $S$ is the deviation;
the step of computing, based on the field strength of the RF alternating magnetic field required when the surface temperature of the local coil is equal to a safe temperature upper limit and the conversion coefficient, a maximum permissible field strength of the RF alternating magnetic field at the center of the detection hole, comprises:

$$B1\_c = B1\_rf * \alpha$$

where $B1\_c$ is the field strength of the RF alternating magnetic field required when the surface temperature of the local coil is equal to the safe temperature upper limit, and $B1\_rf$ is the maximum permissible field strength of the RF alternating magnetic field at the center of the detection hole.

The step of determining, based on the perpendicular distance between the local coil and the center of the detection hole, a deviation between the field strength of an RF alternating magnetic field at the position of the local coil during an MR scan and the field strength of the RF alternating magnetic field at the center of the detection hole, comprises:
looking up a deviation corresponding to the perpendicular distance between the local coil and the center of the detection hole in a pre-established perpendicular distance—deviation correspondence table, and using the looked-up deviation as the deviation between the field strength of the RF alternating magnetic field at the position of the local coil during an MR scan and the field strength of the RF alternating magnetic field at the center of the detection hole,
wherein deviations between the field strength of the RF alternating magnetic field at the position of the local coil during an MR scan and the field strength of the RF alternating magnetic field at the center of the detection hole are measured in advance for different values of the perpendicular distance between the local coil and the center of the detection hole, and the perpendicular distance—deviation correspondence table is established according to the measurement results.

After the step of computing a maximum permissible field strength of the RF alternating magnetic field at the center of the detection hole, the method further comprises:

in a pre-scanning stage of the MR scanner, controlling the MR scanner to use a default RF voltage to transmit an RF signal, measuring the field strength of the RF alternating magnetic field at the center of the detection hole, and computing a coefficient of proportionality between RF voltage and field strength of the RF alternating magnetic field at the center of the detection hole according to the default RF voltage and the measured field strength;

choosing a field strength no greater than the maximum permissible field strength as a reference field strength of the RF alternating magnetic field at the center of the detection hole, and computing an RF operating voltage according to the reference field strength and the coefficient of proportionality;

in a formal scanning stage of the MR scanner, controlling the MR scanner to use the RF operating voltage to transmit an RF signal.

The step of measuring a perpendicular distance between a local coil placed on a scanned part of a patient and the center of a detection hole of an MR scanner, comprises:

when the patient is lying on a bed board of the MR scanner and the local coil has been placed on the scanned part of the patient and the patient has not yet been pushed into the detection hole, activating a 3D camera mounted above the bed board, detecting the positions of the local coil and the bed board in an image acquired by the camera, computing a perpendicular distance between the local coil and the bed board according to the positions of the local coil and the bed board, and computing the perpendicular distance between the local coil and the center of the detection hole with reference to a perpendicular distance between the bed board and the center of the detection hole; or computing the perpendicular distance between the local coil and the center of the detection hole according to 3D spatial coordinates of the local coil as measured by a 3D Hall sensor placed on the local coil and 3D spatial coordinates of the center of the detection hole; or when the patient is pushed into the detection hole, controlling a laser reflector disposed at the top point of a detection hole wall to emit a laser signal, computing a perpendicular distance between the local coil and the top point of the detection hole wall according to a reflected signal received by the laser reflector, and computing the perpendicular distance between the local coil and the center of the detection hole with reference to the radius of the detection hole.

A method for limiting an RF alternating magnetic field in MR scanning, wherein the method comprises:

measuring a perpendicular distance between a local coil placed on a scanned part of a patient and the top point of a detection hole wall of a magnetic resonance (MR) scanner;

acquiring a maximum permissible field strength of the RF alternating magnetic field required when the surface temperature of the local coil is equal to a safe temperature upper limit;

based on the perpendicular distance and the maximum permissible field strength, determining an RF operating voltage of the MR scanner.

In the above aspect, by measuring the perpendicular distance between the local coil and the top point of the detection hole wall of the MR scanner, and acquiring the maximum permissible field strength of the RF alternating magnetic field required when the surface temperature of the local coil is equal to a safe temperature upper limit, and determining the RF operating voltage of the MR scanner according to the perpendicular distance and the maximum permissible field strength, it is possible to limit the RF alternating magnetic field to a smaller but still effective field strength range, thus reducing wastage of RF alternating magnetic field performance while ensuring patient safety and MR imaging quality.

The step of determining an RF operating voltage of the MR scanner based on the perpendicular distance and the maximum permissible field strength, comprises:

in a pre-scanning stage of the MR scanner, controlling the MR scanner to use a default RF voltage to transmit an RF signal, determining the position of the local coil according to the perpendicular distance between the local coil and the top point of the detection hole wall of the MR scanner, measuring the field strength of the RF alternating magnetic field at the position of the local coil, and computing a coefficient of proportionality between RF voltage and field strength of the RF alternating magnetic field at the position of the local coil according to the default RF voltage and the measured field strength;

choosing a field strength no greater than the maximum permissible field strength as a reference field strength of the RF alternating magnetic field at the position of the local coil, and computing an RF operating voltage according to the reference field strength and the coefficient of proportionality;

in a formal scanning stage of the MR scanner, controlling the MR scanner to use the RF operating voltage to transmit an RF signal.

The step of measuring a perpendicular distance between a local coil placed on a scanned part of a patient and the top point of a detection hole wall of an MR scanner, comprises:

when the patient is lying on a bed board of the MR scanner and the local coil has been placed on the scanned part of the patient and the patient has not yet been pushed into the detection hole, activating a 3D camera mounted above the bed board, detecting the positions of the local coil and the bed board in an image acquired by the camera, computing a perpendicular distance between the local coil and the bed board according to the positions of the local coil and the bed board, and computing the perpendicular distance between the local coil and the top point of the detection hole wall with reference to a perpendicular distance between the bed board and the top point of the detection hole wall; or computing the perpendicular distance between the local coil and the top point of the detection hole wall according to 3D spatial coordinates of the local coil as measured by a 3D Hall sensor placed on the local coil and 3D spatial coordinates of the top point of the detection hole wall; or when the patient is pushed into the detection hole, controlling a laser reflector disposed at the top point of the detection hole wall to emit a laser signal, and computing the perpendicular distance between the local coil and the top point of the detection hole wall according to a reflected signal received by the laser reflector.

An apparatus for limiting an RF alternating magnetic field in MRI, the apparatus comprising:
  a distance measurement module, for measuring a perpendicular distance between a local coil placed on a scanned part of a patient and the center of a detection hole of a magnetic resonance (MR) scanner;
  a field strength deviation detection module, for determining, based on the perpendicular distance between the local coil and the center of the detection hole, a deviation between the field strength of the RF alternating magnetic field at the position of the local coil during an MR scan and the field strength of the RF alternating magnetic field at the center of the detection hole;
  a field strength conversion coefficient computing module, for computing, based on the deviation, a conversion coefficient for conversion between the field strength of the RF alternating magnetic field at the position of the local coil and the field strength of the RF alternating magnetic field at the center of the detection hole;
  a field strength limiting module, for computing, based on the field strength of the RF alternating magnetic field required when the surface temperature of the local coil is equal to a safe temperature upper limit and the conversion coefficient, a maximum permissible field strength of the RF alternating magnetic field at the center of the detection hole.

An apparatus for limiting an RF alternating magnetic field in MR scanning, the apparatus comprising:
  a distance measurement module, for measuring a perpendicular distance between a local coil placed on a scanned part of a patient and the top point of a detection hole wall of a magnetic resonance (MR) scanner;
  a field strength limiting module, for acquiring a maximum permissible field strength of the RF alternating magnetic field required when the surface temperature of the local coil is equal to a safe temperature upper limit;
  a scanning control module, for determining an RF operating voltage of the MR scanner based on the perpendicular distance and the maximum permissible field strength.

An MR scanner, comprising the apparatus for limiting an RF alternating magnetic field in MR scanning according to any one of the above aspects.

The aspects of the present disclosure can limit the B1 field to a smaller but still effective field strength range, reducing wastage of B1 field performance while ensuring patient safety and MR imaging quality.

BRIEF DESCRIPTION OF THE DRAWINGS

Preferred aspects of the present disclosure are described in detail below with reference to the accompanying figures, to give those skilled in the art a clearer understanding of the abovementioned and other features and advantages of the present disclosure. In the figures.

| Key to the figures: | |
|---|---|
| Label | Meaning |
| 21 | top point of detection hole wall |
| 301-305 | steps |
| 41 | 3D camera |
| 42 | bed board |
| 43 | detection hole |
| 51, 71 | pre-scanning region |
| 52, 72 | FOV |
| 601-603 | steps |
| 80 | B1 field limiting apparatus in MRI as provided in the first aspect of the present disclosure |
| 81 | distance measurement module provided in the first aspect of the present disclosure |
| 82 | field strength deviation detection module provided in the first aspect of the present disclosure |
| 83 | field strength conversion coefficient computing module provided in the first aspect of the present disclosure |
| 84 | field strength limiting module provided in the first aspect of the present disclosure |
| 85 | scanning control module provided in the first aspect of the present disclosure |
| 90 | B1 field limiting apparatus in MRI as provided in the second aspect of the present disclosure |
| 91 | distance measurement module provided in the second aspect of the present disclosure |
| 92 | field strength limiting module provided in the second aspect of the present disclosure |
| 93 | scanning control module provided in the second aspect of the present disclosure |

DETAILED DESCRIPTION

In order to clarify the object, technical solution and advantages of the present disclosure, the present disclosure is explained in further detail below by way of aspects.

When an MR scanner is operating, it can be found through analysis of the B1 field strength distribution in the detection hole of the MR scanner that: the B1 field strength is not uniform in the perpendicular direction of the detection hole through the hole center (i.e. the direction through the hole center and perpendicular to the horizontal plane); specifically, the B1 field strength is weakest at the hole center, and the B1 field strength increases as the distance from the hole center increases, with the B1 field strength being strongest at the top point of the hole wall (i.e. the highest point of the detection hole wall).

Figure 1:
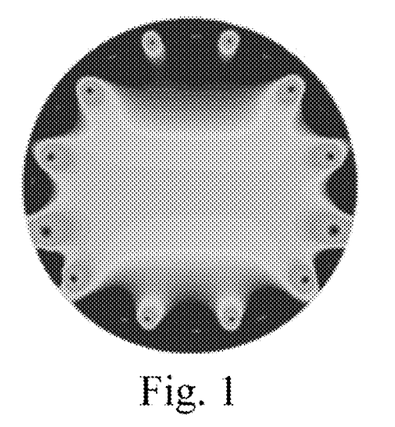
FIG. 1 is a distribution of the B1 field strength in a cross section of a patient during an MR scan.

FIG. 1 is a distribution of the B1 field strength in a cross section of a patient during an MR scan; as can be seen, the B1 field strength gradually increases in directions from the center of the detection hole to the hole wall.

Figure 2:
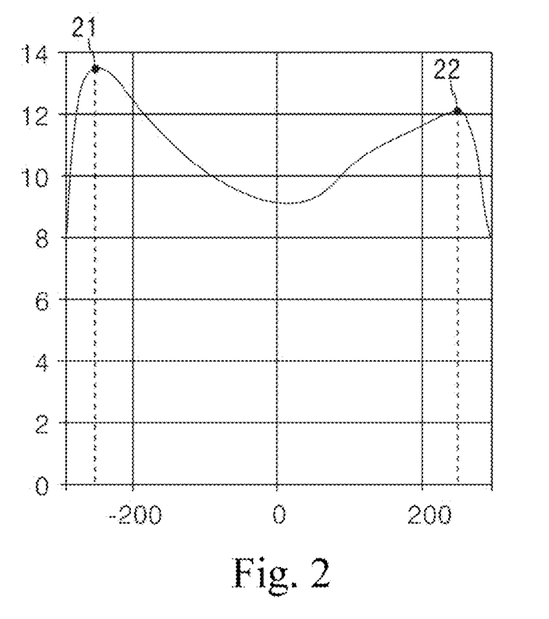
FIG. 2 is a chart of the distribution of the B1 field strength in the perpendicular direction through the hole center, in the detection hole of an MR scanner.

FIG. 2 is a chart of the distribution of the B1 field strength in the perpendicular direction through the hole center, in the detection hole of an MR scanner, during an MR scan. The horizontal axis is the distance from the hole center in the perpendicular direction through the hole center in the detection hole, in units of mm (millimeters), with 0 corresponding to the hole center. The vertical axis is the B1 field strength, in units of µT (microteslas), with 21 corresponding to the top point of the detection hole wall, and 22 corresponding to the lowest point of the detection hole wall. As can be seen, the B1 field strength gradually increases in directions from the center of the detection hole to the hole wall. Since the profile of the transmitting body coil of the MR scanner is not a complete circle, the transmitting body coil has a semi-circular distribution on the upper half-circumference of the detection hole, while the transmitting body coil has a slightly oval, rather than a semi-circular, distribution on the lower half-circumference of the detection hole; thus, the field strength distribution is not symmetric above and below the center of the detection hole (i.e. at the left and right of the curve in FIG. 2). It can also be seen from FIG. 2 that the B1 field strength near the detection hole wall is about 1.5 times the B1 field strength at the hole center, so if a local coil is actually not close to the hole wall, about 1−(1/1.5)=33% of the B1 performance in MRI imaging will be sacrificed.

Based on the above analysis, it can be seen that if the position of a local coil can be ascertained accurately, the B1 field strength can be set accurately.

Figure 3:
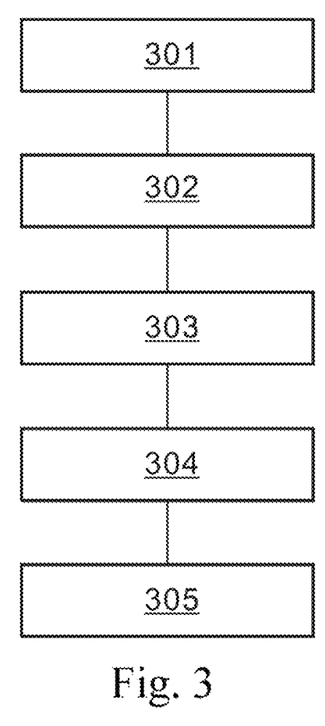
FIG. 3 is a flow chart of a B1 field limiting method in MRI as provided in a first aspect of the present disclosure.

FIG. 3 is a flow chart of a B1 field limiting method in MRI as provided in a first aspect of the present disclosure, specifically comprising the following steps:

Step 301: measuring a perpendicular distance between a local coil placed on a scanned part of a patient and the center of a detection hole of an MR scanner.

In an optional aspect, this step may be realized by one of the following three methods.

Method 1: when the patient is lying on a bed board of the MR scanner and the local coil has been placed on the scanned part of the patient and the patient has not yet been pushed into the detection hole, a 3D camera mounted above the bed board is activated, the positions of the local coil and the bed board are detected in an image acquired by the camera, a perpendicular distance between the local coil and the bed board is computed according to the positions of the local coil and the bed board, and the perpendicular distance between the local coil and the center of the detection hole is computed with reference to a perpendicular distance between the bed board and the center of the detection hole.

Figure 4:
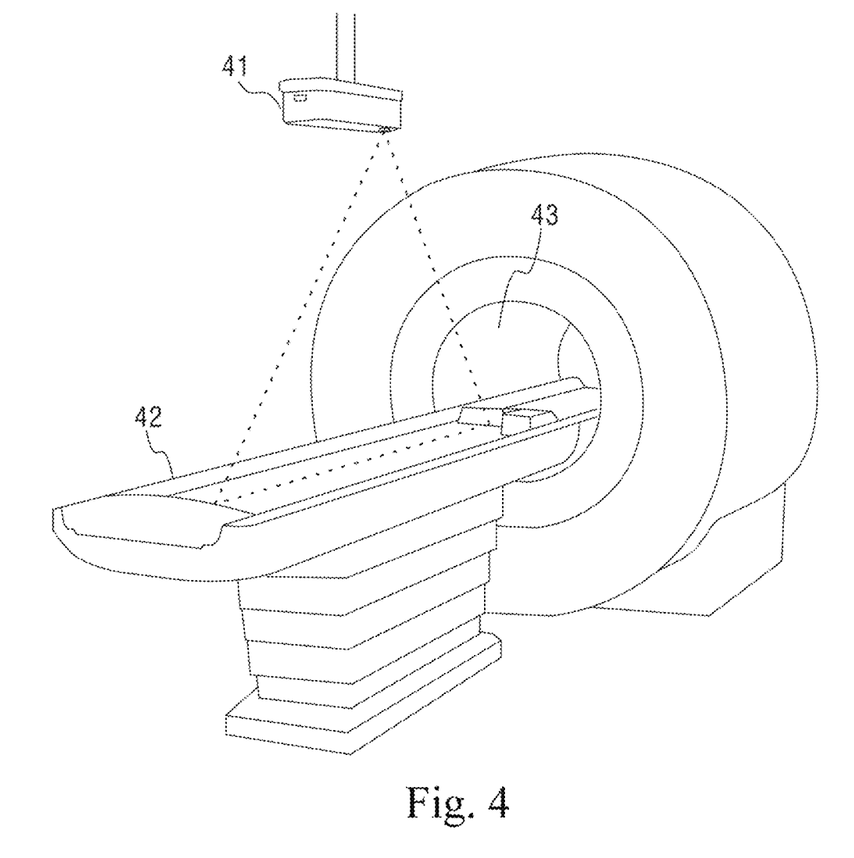
FIG. 4 is a schematic drawing of the use of method 1 in the first aspect of the present disclosure to measure the perpendicular distance between the local coil and the center of the detection hole.

FIG. 4 is a schematic drawing of the use of method 1 to measure the perpendicular distance between the local coil and the center of the detection hole. 41 is the 3D camera, 42 is the bed board, and 43 is the detection hole.

Method 2: the perpendicular distance between the local coil and the center of the detection hole is computed according to 3D spatial coordinates of the local coil as measured by a 3D Hall sensor placed on the local coil and 3D spatial coordinates of the center of the detection hole.

Method 3: when the patient is pushed into the detection hole, a laser reflector disposed at the top point of the detection hole wall is controlled to emit a laser signal, a perpendicular distance between the local coil and the top point of the detection hole wall is computed according to a reflected signal received by the laser reflector, and the perpendicular distance between the local coil and the center of the detection hole is computed with reference to the radius of the detection hole.

The top point of the detection hole wall is the highest point of the detection hole wall.

Step 302: based on the perpendicular distance between the local coil and the center of the detection hole, the deviation between the B1 field strength at the position of the local coil during an MR scan and the B1 field strength at the center of the detection hole is determined.

In an optional aspect, a deviation corresponding to the perpendicular distance between the local coil and the center of the detection hole is looked up in a pre-established perpendicular distance—deviation correspondence table, and the looked-up deviation is used as the deviation between the RF B1 field strength at the position of the local coil during an MR scan and the B1 field strength at the center of the detection hole, wherein deviations between the B1 field strength at the position of the local coil during an MR scan and the B1 field strength at the center of the detection hole are measured in advance for different values of the perpendicular distance between the local coil and the center of the detection hole, and the perpendicular distance—deviation correspondence table is established according to the measurement results.

An example of a perpendicular distance—deviation correspondence table is shown in Table 1:

TABLE 1

| Perpendicular distance between local coil and center of detection hole (mm) | Perpendicular distance between local coil and top point of detection hole wall (mm) | Deviation between the B1 field strength at position of local coil and B1 field strength at center of detection hole (dB) | B1 field strength at position of local coil (µT) |
|---|---|---|---|
| 0 | 300 | 0 | B1_rf |
| 10 | 290 | 0.1 | $B1\_rf*10^{0.1/20}$ |
| 20 | 280 | 0.2 | $B1\_rf*10^{0.2/20}$ |
| 30 | 270 | 0.3 | $B1\_rf*10^{0.3/20}$ |
| ... | ... | ... | ... |
| 300 | 0 | 3.36 | $B1\_rf*10^{3.36/20}$ |

Based on Table 1, when the perpendicular distance between the local coil and the center of the detection hole is obtained, the table can be checked to determine the deviation between the B1 field strength at the position of the local coil during an MR scan and the B1 field strength at the center of the detection hole.

Step 303: a conversion coefficient for conversion between the B1 field strength at the position of the local coil and the B1 field strength at the center of the detection hole is computed, based on the deviation.

In an optional aspect, this step may be represented by the following formula:

$$\alpha = 10^{S/20}$$

where α is the conversion coefficient, and S is the deviation in step 302, the deviation being in units of dB.

Step 304: the maximum permissible field strength of the B1 field at the center of the detection hole is computed according to the B1 field strength required when the surface temperature of the local coil is equal to a safe temperature upper limit and the conversion coefficient obtained in step 303.

According to the IEC standard, the safe temperature upper limit is 41° C.

In an optional aspect, this step may be represented by the following formula:

$$B1\_c = B1\_rf * \alpha$$

where B1_c is the B1 field strength required when the surface temperature of the local coil is equal to the safe temperature upper limit, B1_rf is the maximum permissible field strength of the B1 field at the center of the detection hole, and a is the conversion coefficient.

Step 305: based on the maximum permissible field strength in step 304, an RF operating voltage of the MR scanner is determined.

In an optional aspect, step 305 specifically comprises:

Step 3051: in a pre-scanning stage of the MR scanner, the MR scanner is controlled to use a default RF voltage to transmit an RF signal, the B1 field strength at the center of the detection hole is measured, and a coefficient of proportionality between RF voltage and B1 field strength at the center of the detection hole is computed according to the default RF voltage and the measured field strength.

The RF voltage is directly proportional to the B1 field strength at the center of the detection hole.

Step 3052: a field strength no greater than the maximum permissible field strength in step 304 is chosen as a reference field strength of the B1 field at the center of the detection hole, and the RF operating voltage is computed according to the reference field strength and the coefficient of proportionality in step 3051.

Step 3053: in a formal scanning stage of the MR scanner, the MR scanner is controlled to use the RF operating voltage to transmit an RF signal.

In the above aspect, by measuring the perpendicular distance between the local coil and the center of the detection hole of the MR scanner, since the perpendicular distance between the local coil and the center of the detection hole of the MR scanner is in a correspondence relationship with the field strength deviation therebetween, and there is a fixed conversion relationship between the field strengths at the local coil and the center of the detection hole with the field strength deviation therebetween, it is possible to compute the maximum permissible field strength of the B1 field at the center of the detection hole according to the B1 field strength required when the surface temperature of the local coil is equal to a safe temperature upper limit and the conversion relationship, and it is thereby possible to limit the B1 field to a smaller but still effective field strength range, thus reducing wastage of B1 field performance while ensuring patient safety and MR imaging quality.

Figure 5:
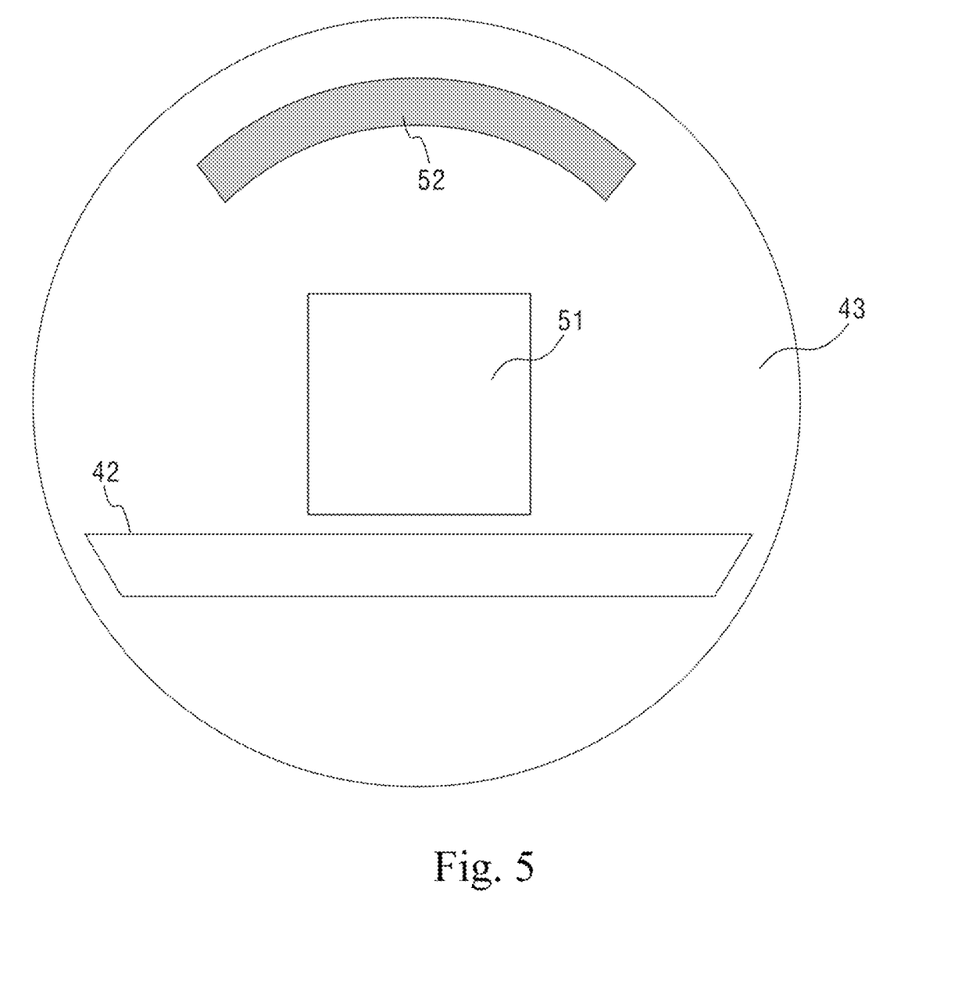
FIG. 5 is a schematic diagram of a pre-scanning region and an FOV (Field of View, imaging region) in the first aspect of the present disclosure.

FIG. 5 shows a schematic diagram of a pre-scanning region 51 and an FOV (Field of View, imaging region) 52 in the first aspect of the present disclosure. As shown in FIG. 5, the pre-scanning region 51 is at the center of the detection hole 43, and the FOV 52 is at the position of the local coil, wherein 42 is the bed board.

Figure 6:
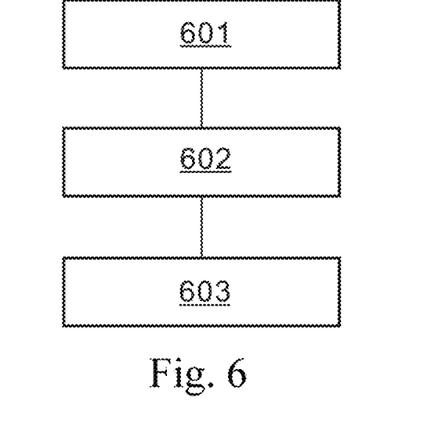
FIG. 6 is a flow chart of a B1 field limiting method in MRI as provided in a second aspect of the present disclosure.

FIG. 6 is a flow chart of a B1 field limiting method in MRI as provided in a second aspect of the present disclosure, specifically comprising the following steps:

Step 601: measuring a perpendicular distance between a local coil placed on a scanned part of a patient and the top point of a detection hole wall of a magnetic resonance (MR) scanner.

In an optional aspect, this step may be realized by one of the following three methods.

Method 1: when the patient is lying on a bed board of the MR scanner and the local coil has been placed on the scanned part of the patient and the patient has not yet been pushed into the detection hole, a 3D camera mounted above the bed board is activated, the positions of the local coil and the bed board are detected in an image acquired by the camera, a perpendicular distance between the local coil and the bed board is computed according to the positions of the local coil and the bed board, and the perpendicular distance between the local coil and the top point of the detection hole wall is computed with reference to a perpendicular distance between the bed board and the top point of the detection hole wall.

Method 2: the perpendicular distance between the local coil and the top point of the detection hole wall is computed according to 3D spatial coordinates of the local coil as measured by a 3D Hall sensor placed on the local coil and 3D spatial coordinates of the top point of the detection hole wall.

Method 3: when the patient is pushed into the detection hole, a laser reflector disposed at the top point of the detection hole wall is controlled to emit a laser signal, and the perpendicular distance between the local coil and the top point of the detection hole wall is computed according to a reflected signal received by the laser reflector.

Step 602: the maximum permissible field strength of the RF B1 field required when the surface temperature of the local coil is equal to a safe temperature upper limit is acquired.

Step 603: based on the perpendicular distance in step 601 and the maximum permissible field strength in step 602, an RF operating voltage of the MR scanner is determined.

In an optional aspect, step 603 specifically comprises:

Step 6031: in a pre-scanning stage of the MR scanner, the MR scanner is controlled to use a default RF voltage to transmit an RF signal, the position of the local coil is determined according to the perpendicular distance between the local coil and the top point of the detection hole wall of the MR scanner as determined in step 601, the B1 field strength at the position of the local coil is measured, and a coefficient of proportionality between RF voltage and B1 field strength at the position of the local coil is computed;

Step 6032: a field strength no greater than the maximum permissible field strength in step 602 is chosen as a reference field strength of the B1 field at the position of the local coil, and the RF operating voltage is computed according to the reference field strength and the coefficient of proportionality in step 6031.

Step 6033: in a formal scanning stage of the MR scanner, the MR scanner is controlled to use the RF operating voltage to transmit an RF signal.

In the above aspect, by measuring the perpendicular distance between the local coil and the top point of the detection hole wall of the MR scanner, and acquiring the maximum permissible field strength of the B1 field required when the surface temperature of the local coil is equal to a safe temperature upper limit, and determining the RF operating voltage of the MR scanner according to the perpendicular distance and the maximum permissible field strength, it is possible to limit the B1 field to a smaller but still effective field strength range, thus reducing wastage of B1 field performance while ensuring patient safety and MR imaging quality.

Figure 7:
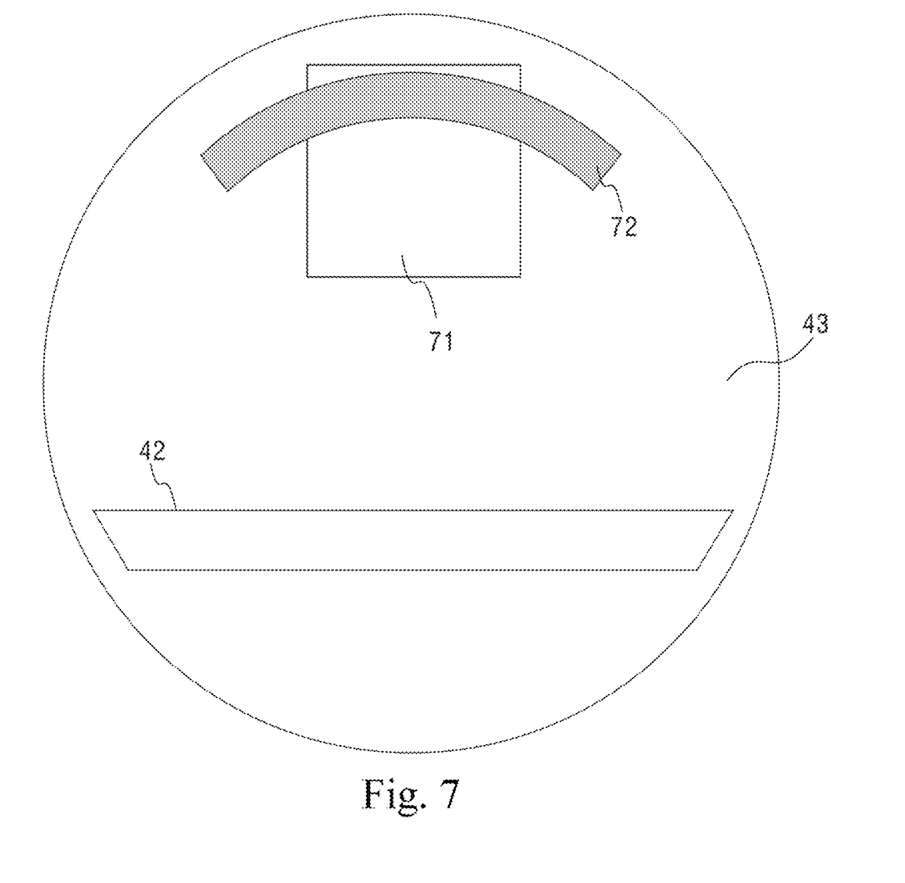
FIG. 7 is a schematic diagram of a pre-scanning region and an FOV in the second aspect of the present disclosure.

FIG. 7 shows a schematic diagram of a pre-scanning region 71 and an FOV 72 in the second aspect of the present disclosure. As shown in FIG. 7, the pre-scanning region 71 and the FOV 72 are both at the position of the local coil, wherein 42 is the bed board and 43 is the detection hole.

Figure 8:
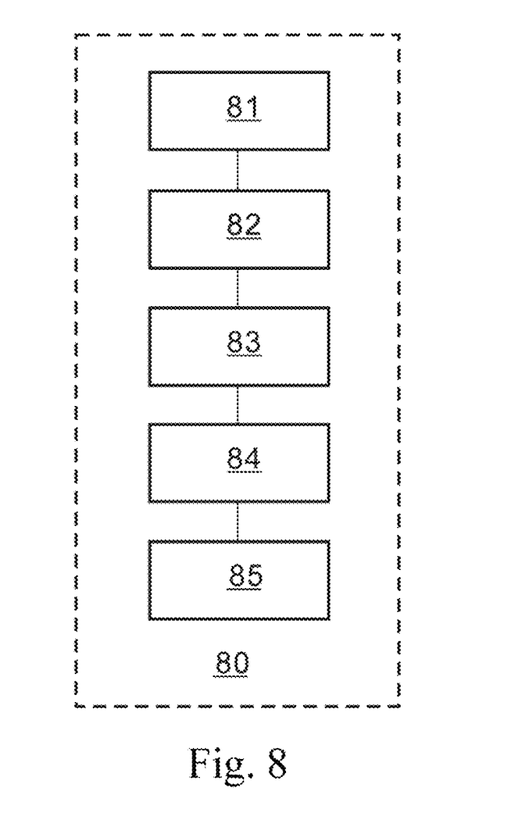
FIG. 8 is a structural schematic diagram of a B1 field limiting apparatus in MRI as provided in the first aspect of the present disclosure.

FIG. 8 is a structural schematic diagram of a B1 field limiting apparatus 80 in MRI as provided in the first aspect of the present disclosure, the apparatus 80 mainly comprising:

a distance measurement module 81, for measuring a perpendicular distance between a local coil placed on a scanned part of a patient and the center of a detection hole of an MR scanner;

a field strength deviation detection module 82, for determining the deviation between the B1 field strength at the position of the local coil during an MR scan and the B1 field strength at the center of the detection hole, based on the perpendicular distance between the local coil and the center of the detection hole as measured by the distance measurement module 81;

a field strength conversion coefficient computing module 83, for computing a conversion coefficient for conversion between the B1 field strength at the position of the local coil and the B1 field strength at the center of the detection hole based on the deviation determined by the field strength deviation detection module 82;

a field strength limiting module 84, for computing the maximum permissible field strength of the B1 field at the center of the detection hole, based on the B1 field strength required when the surface temperature of the local coil is equal to a safe temperature upper limit and the conversion coefficient computed by the field strength conversion coefficient computing module 83.

In an optional aspect, the field strength conversion coefficient computing module 83 is specifically used to compute $\alpha = 10^{S/20}$, where $\alpha$ is the conversion coefficient for conversion between the B1 field strength at the position of the local coil and the B1 field strength at the center of the detection hole, and S is the deviation determined by the field strength deviation detection module 82, the deviation being in units of dB;

the field strength limiting module 84 is specifically used to compute $B1\_c = B1\_rf * \alpha$, where $B1\_c$ is the B1 field strength required when the surface temperature of the local coil is equal to the safe temperature upper limit, and $B1\_rf$ is the maximum permissible field strength of the B1 field at the center of the detection hole.

In an optional aspect, the field strength deviation detection module 82 is specifically used to look up the deviation corresponding to the perpendicular distance between the local coil and the center of the detection hole as measured by the distance measurement module 81 in a pre-established perpendicular distance—deviation correspondence table, and use the looked-up deviation as the deviation between the RF B1 field strength at the position of the local coil during an MR scan and the B1 field strength at the center of the detection hole, wherein deviations between the B1 field strength at the position of the local coil during an MR scan and the B1 field strength at the center of the detection hole are measured in advance for different values of the perpendicular distance between the local coil and the center of the detection hole, and the perpendicular distance—deviation correspondence table is established according to the measurement results.

In an optional aspect, the apparatus 80 further comprises a scanning control module 85, for: in a pre-scanning stage of the MR scanner, controlling the MR scanner to use a default RF voltage to transmit an RF signal, measuring the B1 field strength at the center of the detection hole, and computing a coefficient of proportionality between RF voltage and B1 field strength at the center of the detection hole according to the default RF voltage and the measured field strength; choosing a field strength no greater than the maximum permissible field strength computed by the field strength limiting module 84 as a reference field strength of the B1 field at the center of the detection hole, and computing an RF operating voltage according to the reference field strength and the coefficient of proportionality; and in a formal scanning stage of the MR scanner, controlling the MR scanner to use the RF operating voltage to transmit an RF signal.

In an optional aspect, the distance measurement module 81 is specifically for:

when the patient is lying on a bed board of the MR scanner and the local coil has been placed on the scanned part of the patient and the patient has not yet been pushed into the detection hole, activating a 3D camera mounted above the bed board, detecting the positions of the local coil and the bed board in an image acquired by the camera, computing a perpendicular distance between the local coil and the bed board according to the positions of the local coil and the bed board, and computing the perpendicular distance between the local coil and the center of the detection hole with reference to a perpendicular distance between the bed board and the center of the detection hole; or computing the perpendicular distance between the local coil and the center of the detection hole according to 3D spatial coordinates of the local coil as measured by a 3D Hall sensor placed on the local coil and 3D spatial coordinates of the center of the detection hole; or when the patient is pushed into the detection hole, controlling a laser reflector disposed at the top point of the detection hole wall to emit a laser signal, computing a perpendicular distance between the local coil and the top point of the detection hole wall according to a reflected signal received by the laser reflector, and computing the perpendicular distance between the local coil and the center of the detection hole with reference to the radius of the detection hole.

Figure 9:
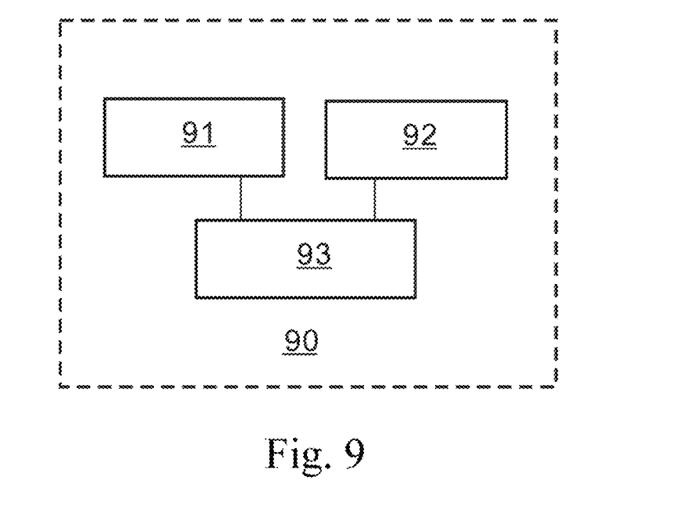
FIG. 9 is a structural schematic diagram of a B1 field limiting apparatus in MRI as provided in the second aspect of the present disclosure.

FIG. 9 is a structural schematic diagram of a B1 field limiting apparatus 90 in MRI as provided in the second aspect of the present disclosure, the apparatus 90 mainly comprising:

a distance measurement module 91, for measuring a perpendicular distance between a local coil placed on a scanned part of a patient and the top point of a detection hole wall of an MR scanner;

a field strength limiting module 92, for acquiring the maximum permissible field strength of the B1 field required when the surface temperature of the local coil is equal to a safe temperature upper limit;

a scanning control module 93, for determining an RF operating voltage of the MR scanner based on the perpendicular distance measured by the distance measurement module 91 and the maximum permissible field strength acquired by the field strength limiting module 92.

In an optional aspect, the scanning control module 93 is specifically for: in a pre-scanning stage of the MR scanner, controlling the MR scanner to use a default RF voltage to transmit an RF signal, determining the position of the local coil according to the perpendicular distance between the local coil and the top point of the detection hole wall of the MR scanner as measured by the distance measurement module 91, measuring the B1 field strength at the position of the local coil, and computing a coefficient of proportionality between RF voltage and B1 field strength at the position of the local coil according to the default RF voltage and the measured field strength; choosing a field strength no greater than the maximum permissible field strength acquired by the field strength limiting module 92 as a reference field strength of the B1 field at the position of the local coil, and computing the RF operating voltage according to the reference field strength and the coefficient of proportionality; and in a formal scanning stage of the MR scanner, controlling the MR scanner to use the RF operating voltage to transmit an RF signal.

In an optional aspect, the distance measurement module 91 is specifically for:

when the patient is lying on a bed board of the MR scanner and the local coil has been placed on the scanned part of the patient and the patient has not yet been pushed into the detection hole, activating a 3D camera mounted above the bed board, detecting the positions of the local coil and the bed board in an image acquired by the camera, computing a perpendicular distance between the local coil and the bed board according to the positions of the local coil and the bed board, and computing the perpendicular distance between the local coil and the top point of the detection hole wall with reference to a perpendicular distance between the bed board and the top point of the detection hole wall; or computing the perpendicular distance between the local coil and the top point of the detection hole wall according to 3D spatial coordinates of the local coil as measured by a 3D Hall sensor placed on the local coil and 3D spatial coordinates of the top point of the detection hole wall; or when the patient is pushed into the detection hole, controlling a laser reflector disposed at the top point of the detection hole wall to emit a laser signal, and computing the perpendicular distance between the local coil and the top point of the detection hole wall according to a reflected signal received by the laser reflector.

The aspects of the present disclosure further provide an MR scanner, comprising the B1 field limiting apparatus 80 or 90 in MRI according to any one of the above aspects.

The aspects above are merely preferred aspects of the present disclosure, which are not intended to limit it. Any amendments, equivalent substitutions or improvements etc. made within the spirit and principles of the present disclosure shall be included in the scope of protection thereof.

The invention claimed is:

1. A method for limiting an RF (radio frequency) alternating magnetic field in MRI (magnetic resonance imaging), the method comprising:

measuring a perpendicular distance between a local coil placed on a scanned part of a patient and a center of a detection hole of an MR scanner;

based on the perpendicular distance between the local coil and the center of the detection hole, determining a deviation between a field strength of the RF alternating magnetic field at a position of the local coil during an MR scan and a field strength of the RF alternating magnetic field at the center of the detection hole;

based on the deviation, computing a conversion coefficient for conversion between the field strength of the RF alternating magnetic field at the position of the local coil and the field strength of the RF alternating magnetic field at the center of the detection hole; and based on a field strength of the RF alternating magnetic field required when a surface temperature of the local coil is equal to a safe temperature upper limit and the conversion coefficient, computing a maximum permissible field strength of the RF alternating magnetic field at the center of the detection hole.

2. The method of claim 1, wherein the step of computing, based on the deviation, a conversion coefficient for conversion between the field strength of the RF alternating magnetic field at the position of the local coil and the field strength of the RF alternating magnetic field at the center of the detection hole, comprises:

$$\alpha=10^{S/20},$$

where $\alpha$ is the conversion coefficient, and $S$ is the deviation in units of dB; and the step of computing, based on the field strength of the RF alternating magnetic field required when the surface temperature of the local coil is equal to a safe temperature upper limit and the conversion coefficient, a maximum permissible field strength of the RF alternating magnetic field at the center of the detection hole, comprises:

$$B1\_c=B1\_rf*\alpha,$$

where $B1\_c$ is the field strength of the RF alternating magnetic field required when the surface temperature of the local coil is equal to the safe temperature upper limit, and $B1\_rf$ is the maximum permissible field strength of the RF alternating magnetic field at the center of the detection hole.

3. The method of claim 1, wherein the step of determining, based on the perpendicular distance between the local coil and the center of the detection hole, a deviation between the field strength of an RF alternating magnetic field at the position of the local coil during an MR scan and the field strength of the RF alternating magnetic field at the center of the detection hole, comprises:

looking up a deviation corresponding to the perpendicular distance between the local coil and the center of the detection hole in a pre-established perpendicular distance—deviation correspondence table, and using the looked-up deviation as the deviation between the field strength of the RF alternating magnetic field at the position of the local coil during an MR scan and the field strength of the RF alternating magnetic field at the center of the detection hole, wherein deviations between the field strength of the RF alternating magnetic field at the position of the local coil during an MR scan and the field strength of the RF alternating magnetic field at the center of the detection hole are measured in advance for different values of the perpendicular distance between the local coil and the center of the detection hole, and the perpendicular distance—deviation correspondence table is established according to the measurement results.

4. The method of claim 1, wherein after the step of computing a maximum permissible field strength of the RF alternating magnetic field at the center of the detection hole, the method further comprises:

in a pre-scanning stage of the MR scanner, controlling the MR scanner to use a default RF voltage to transmit an RF signal, measuring the field strength of the RF alternating magnetic field at the center of the detection hole, and computing a coefficient of proportionality between RF voltage and field strength of the RF alternating magnetic field at the center of the detection hole according to the default RF voltage and the measured field strength;

choosing a field strength no greater than the maximum permissible field strength as a reference field strength of the RF alternating magnetic field at the center of the detection hole, and computing an RF operating voltage according to the reference field strength and the coefficient of proportionality; and in a formal scanning stage of the MR scanner, controlling the MR scanner to use the RF operating voltage to transmit an RF signal.

5. The method of claim 1, wherein the step of measuring a perpendicular distance between a local coil placed on a scanned part of a patient and the center of a detection hole of an MR scanner, comprises:
when the patient is lying on a bed board of the MR scanner and the local coil has been placed on the scanned part of the patient and the patient has not yet been pushed into the detection hole, activating a 3D camera mounted above the bed board, detecting positions of the local coil and the bed board in an image acquired by the camera, computing a perpendicular distance between the local coil and the bed board according to the positions of the local coil and the bed board, and computing the perpendicular distance between the local coil and the center of the detection hole with reference to a perpendicular distance between the bed board and the center of the detection hole; or
computing the perpendicular distance between the local coil and the center of the detection hole according to 3D spatial coordinates of the local coil as measured by a 3D Hall sensor placed on the local coil and 3D spatial coordinates of the center of the detection hole; or
when the patient is pushed into the detection hole, controlling a laser reflector disposed at a top point of a detection hole wall to emit a laser signal, computing a perpendicular distance between the local coil and the top point of the detection hole wall according to a reflected signal received by the laser reflector, and computing the perpendicular distance between the local coil and the center of the detection hole with reference to a radius of the detection hole.

6. A method for limiting an RF (radio frequency) alternating magnetic field in MR (magnetic resonance) scanning, wherein the method comprises:
measuring a perpendicular distance between a local coil placed on a scanned part of a patient and a top point of a detection hole wall of an MR scanner;
acquiring a maximum permissible field strength of the RF alternating magnetic field required when a surface temperature of the local coil is equal to a safe temperature upper limit; and
based on the perpendicular distance and the maximum permissible field strength, determining an RF operating voltage of the MR scanner.

7. The method of claim 6, wherein the step of determining an RF operating voltage of the MR scanner based on the perpendicular distance and the maximum permissible field strength, comprises:
in a pre-scanning stage of the MR scanner, controlling the MR scanner to use a default RF voltage to transmit an RF signal, determining a position of the local coil according to the perpendicular distance between the local coil and the top point of the detection hole wall of the MR scanner, measuring the field strength of the RF alternating magnetic field at the position of the local coil, and computing a coefficient of proportionality between RF voltage and field strength of the RF alternating magnetic field at the position of the local coil according to the default RF voltage and the measured field strength;
choosing a field strength no greater than the maximum permissible field strength as a reference field strength of the RF alternating magnetic field at the position of the local coil, and computing an RF operating voltage according to the reference field strength and the coefficient of proportionality; and
in a formal scanning stage of the MR scanner, controlling the MR scanner to use the RF operating voltage to transmit an RF signal.

8. The method of claim 6, wherein the step of measuring a perpendicular distance between a local coil placed on a scanned part of a patient and the top point of a detection hole wall of an MR scanner, comprises:
when the patient is lying on a bed board of the MR scanner and the local coil has been placed on the scanned part of the patient and the patient has not yet been pushed into the detection hole, activating a 3D camera mounted above the bed board, detecting positions of the local coil and the bed board in an image acquired by the camera, computing a perpendicular distance between the local coil and the bed board according to the positions of the local coil and the bed board, and computing the perpendicular distance between the local coil and the top point of the detection hole wall with reference to a perpendicular distance between the bed board and the top point of the detection hole wall; or
computing the perpendicular distance between the local coil and the top point of the detection hole wall according to 3D spatial coordinates of the local coil as measured by a 3D Hall sensor placed on the local coil and 3D spatial coordinates of the top point of the detection hole wall; or
when the patient is pushed into the detection hole, controlling a laser reflector disposed at the top point of the detection hole wall to emit a laser signal, and computing the perpendicular distance between the local coil and the top point of the detection hole wall according to a reflected signal received by the laser reflector.

9. An apparatus for limiting an RF (radio frequency) alternating magnetic field in MRI (magnetic resonance imaging), comprising:
a distance measurement module configured to measure a perpendicular distance between a local coil placed on a scanned part of a patient and a center of a detection hole of an MR scanner;
a field strength deviation detection module configured to determine, based on the perpendicular distance between the local coil and the center of the detection hole, a deviation between the field strength of the RF alternating magnetic field at a position of the local coil during an MR scan and the field strength of the RF alternating magnetic field at the center of the detection hole;
a field strength conversion coefficient computing module configured to compute, based on the deviation, a conversion coefficient for conversion between the field strength of the RF alternating magnetic field at the position of the local coil and the field strength of the RF alternating magnetic field at the center of the detection hole; and
a field strength limiting module configured to compute, based on the field strength of the RF alternating magnetic field required when a surface temperature of the local coil is equal to a safe temperature upper limit and the conversion coefficient, a maximum permissible field strength of the RF alternating magnetic field at the center of the detection hole.

10. An MR (magnetic resonance) scanner, comprising the apparatus for limiting the RF alternating magnetic field in MR scanning of claim 9.

11. An apparatus for limiting an RF (radio frequency) alternating magnetic field in MR (magnetic resonance) scanning, comprising:
- a distance measurement module configured to measure a perpendicular distance between a local coil placed on a scanned part of a patient and a top point of a detection hole wall of an MR scanner;
- a field strength limiting module configured to acquire a maximum permissible field strength of the RF alternating magnetic field required when a surface temperature of the local coil is equal to a safe temperature upper limit; and
- a scanning control module configured to determine an RF operating voltage of the MR scanner based on the perpendicular distance and the maximum permissible field strength.

12. An MR (magnetic resonance) scanner, comprising the apparatus for limiting the RF alternating magnetic field in MR scanning of claim 11.

* * * * *